United States Patent [19]

Harper

[11] 3,986,334

[45] Oct. 19, 1976

[54] ELECTRONIC WATCH AND ITS METHOD OF FABRICATION

[75] Inventor: James G. Harper, Dallas, Tex.

[73] Assignee: Texas Instruments Incorporated, Dallas, Tex.

[22] Filed: May 29, 1975

[21] Appl. No.: 581,604

[52] U.S. Cl. ................................ 58/50 R; 58/23 R; 58/23 BA; 29/177; 174/52 FP; 174/52 PE; 357/70; 357/72

[51] Int. Cl.² ........................ G04C 3/00; H05K 5/06

[58] Field of Search .................... 174/52 PE, 52 FP; 317/101 CC, 101 CP, 101 A; 357/65, 68, 72, 70; 58/50 R, 23 R, 23 BA; 29/177

[56] References Cited

UNITED STATES PATENTS

| | | | |
|---|---|---|---|
| 3,759,031 | 9/1973 | McCoullough et al. | 58/50 R |
| 3,784,725 | 1/1974 | Perkins et al. | 174/52 S |

*Primary Examiner*—Stanley J. Witkowski
*Attorney, Agent, or Firm*—Harold Levine; Rene' Grossman; Stephen Sadacca

[57] ABSTRACT

A self-encased electronic watch is fabricated by mounting a semiconductor integrated circuit chip on a metal lead frame. Connectors are utilized to connect the circuit to selected lead frame conductors. The semiconductor chip incorporates all of the electronic circuitry necessary to drive a display with decoded timekeeping signals. The lead frame includes selectively positioned conductors for connection of a display, a variable capacitor, oscillator crystal and battery contacts. The lead frame is plastic encapsulated with the plastic being formed to completely seal the integrated circuit and connectors while providing a ridged mechanical support cavity on the front surface for the display annd filter lens and mechanical support cavities on the back surface for the capacitor, crystal and batteries. Openings are provided in the plastic within the cavities and opposite the cavity formations exposing the selectively positioned conductors so that the display, capacitor and crystal may be electrically connected to the lead frame. The openings opposite the capacitor and crystal cavities on the front surface are plugged with design coordinated plastic plugs. The plastic formation includes extensions for attachment of a band and a cover is provided for the back.

46 Claims, 10 Drawing Figures

ELECTRONIC WATCH AND ITS METHOD OF FABRICATION

This invention relates to electronic watches and, more particularly, to watch modules for electronic watches and their method of fabrication.

Prior art electronic watches have been manufactured by providing movements in the form of electronic modules which are enclosed in a cavity within a metal watch case or other jewelry housing. The module is generally of the hybrid type comprised of a substrate of insulative material on which all of the electronic timekeeping circuitry, display drivers, oscillator crystal, variable capacitor and display elements have been mounted and electrically interconnected. The substrates are generally of two sections, a first section circuit board such as a ceramic or printed circuit board having single or multilayer interconnects on which the timekeeping circuit, display drivers and display elements are mounted and interconnected and a second section which is comprised of molded plastic or other material to provide mechanical support for the oscillator crystal, variable capacitor, battery conductors and battery. The integrated circuit chips providing the timekeeping circuitry and drive functions are mounted on the circuit board and selectively connected to the conductors thereof. The integrated circuits and wires thereto are generally sealed within a drop of epoxy material for the protection thereof. The latter support section of the substrate may include conductors which mate with conductors on the circuit board section or the oscillator crystal, variable capacitor and battery contacts may be electrically connected directly to conductors on the circuit board. The complexity of these prior art modules is exemplified by U.S. Pat. Nos. 3,759,037; 3,803,827; 3,838,566; and 3,817,021. The integrated circuit and other circuit components are relatively inexpensive compared to the cost of manufacturing the module substrate, the attachment and interconnection of the circuit devices to the substrate and circuit board to provide the module and the cost of the case.

It is therefore an object of the present invention to provide an improved electronic watch.

It is another object of the invention to provide a simplified electronic watch.

A further object of the invention is to provide an improved method of fabricating electronic watches.

Another object of the invention is to provide a relatively inexpensive electronic watch.

Still another object of the invention is to provide a self-encased electronic watch module.

These and other objects are accomplished in accordance with the present invention by providing a single metal lead frame upon which a semiconductor integrated circuit chip is mounted. Connectors such as ball bonded wires selectively connect terminal pads on the integrated circuit to selected lead frame conductors. The semiconductor chip which is preferably of the bipolar injection logic type incorporates all of the electronic circuitry necessary to compute time and to drive a display with decoded timekeeping signals. The lead frame includes selectively positioned conductors for connection of a display, variable capacitor, oscillator crystal, time setting and/or demand control switches and battery contacts thereto. The lead frame is plastic encapsulated with the plastic being formed to completely seal the integrated circuit lead frame and connectors within the plastic while providing a mechanical support cavity on the front furface for the display and mechanical support cavities on the back surface for the capacitor, crystal and batteries. A ridge may be provided in the display cavity to separately support a filter or other lens. Openings are provided in the plastic both within the cavities and opposite the cavities exposing the selectively positioned conductors so that the display, capacitor and crystal may be electrically connected to the lead frame. The openings opposite the capacitor and crystal cavities on the front surface are plugged with design coordinated plug members and a removable cover is provided for the back.

The above described watch is fabricated by mounting the semiconductor circuit chip on a mounting pad of the metal lead frame provided therefor. Connectors such as those provided by gold wire are ball bonded between selected terminal pads on the integrated circuit chip and selected lead frame conductors. Alternately, the integrated circuit may be mounted in an upside down fashion with terminal pads of the circuit thermocompression bonded directly to the lead frame. The lead frame is then plastic encapsulated by injection molding techniques. The upper mold is formed to provide, in the front surface of the injected plastic, a cavity for the display and lens, openings exposing one surface of the selectively positioned conductors for the crystal, capacitor and control switches and an opening exposing the conductors in the display cavity to which the display is to be ohmically connected. The lower mold is formed to provide, in the injected plastic, mechanical support cavities for the crystal, variable capacitor and batteries, an opening exposing the opposite surface of the conductors to which the display is to be connected and openings in the mechanical support openings exposing the conductors to which the crystal and capacitor are to be ohmically connected. The display is mounted in the cavity provided therefor on the upper surface of the encapsulated lead frame and selectively electrically connected to the lead frame by means of the opening on the opposite back surface. The crystal and capacitor are inserted in the cavities provided therefor and electrically connected to the selectively positioned lead frame conductors from the openings provided in the upper surface and the upper surface openings are plugged. Battery contacts are inserted in the formed cavities provided for the batteries and electrically connected to selected lead frame contacts provided therefor. A lens or filter is mounted over the display in the ridge provided for that purpose.

Still further objects and advantages of the invention will become apparent from the detailed description and claims and from the accompanying drawings wherein:

Figure 1:
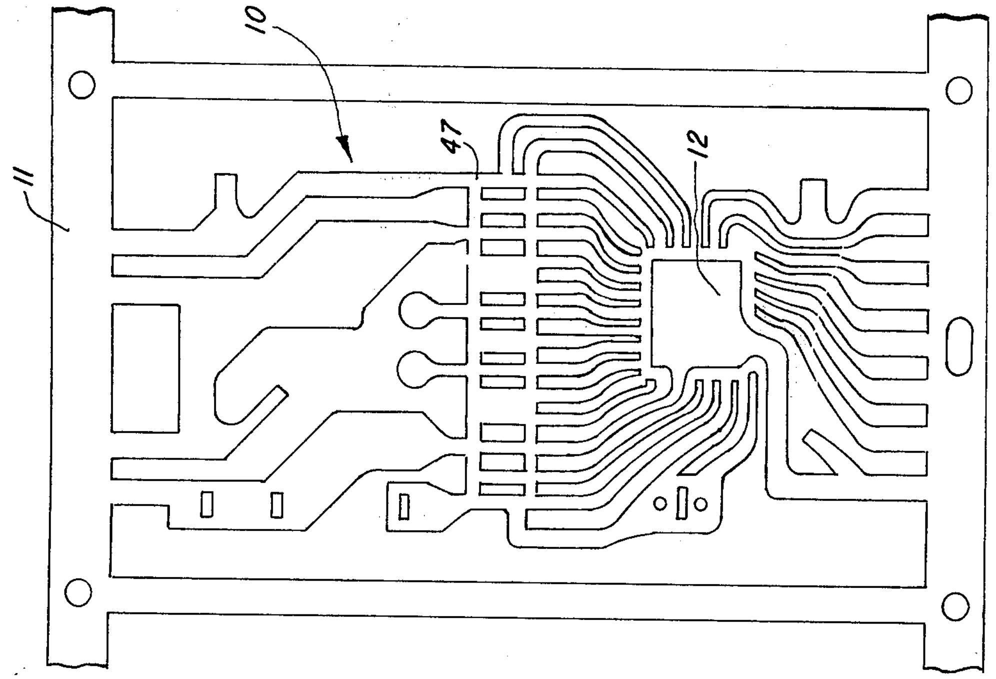
FIG. 1 is a planar view of the upper major surface of a lead frame utilized in accordance with an embodiment of the present invention.

Referring then to the drawings, an electronic watch embodied in the present invention is manufactured by providing a single metal lead frame 10 as shown in FIG. 1. The lead frame 10 is, for example, stamped out of a strip 11 of 0.010 inch thick iron-cobalt-nickel alloy such as Kovar. A number of the lead frames 10 are conveniently stamped out of a single strip 11 with a portion of the strip 11 utilized as a carrier to facilitate handling in process. Another portion 47 of the strip is also left in place to hold some of the lead frame conductors in place through processing.

Figure 2:
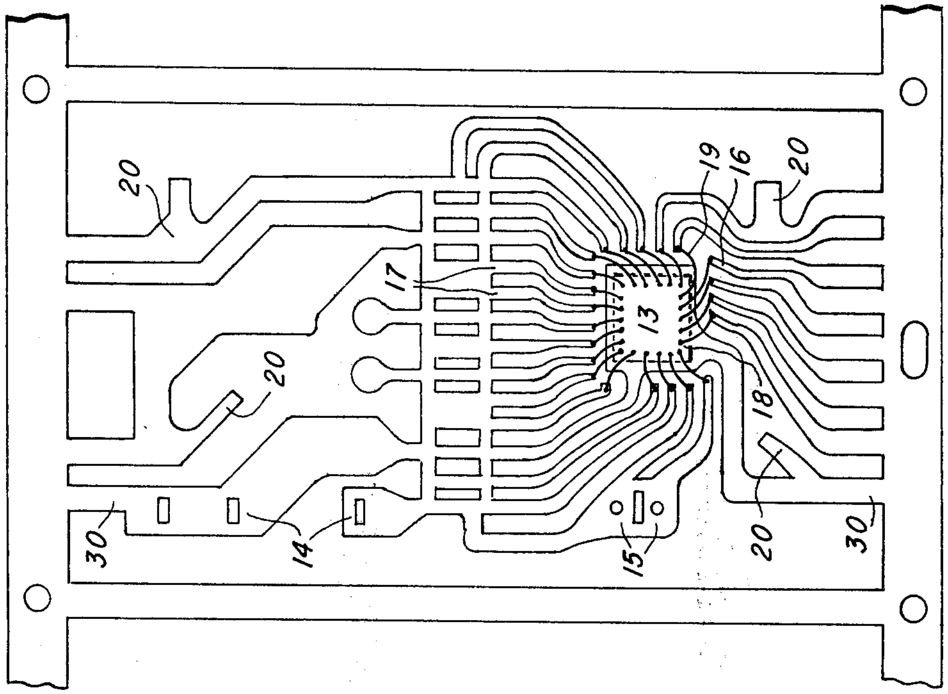
FIG. 2 is a planar view showing a semiconductor integrated circuit chip being mounted on a pad of the lead frame of FIG. 1.

A mounting pad 12 is provided by the lead frame 10 upon which a semiconductor integrated circuit chip 13 is mounted, as shown in FIG. 2. Connectors such as ball bonded gold wires 19 selectively connect terminal pads 18 on the integrated circuit chip to selected lead frame conductors 16. The semiconductor chip 13 which is preferably of the bipolar injection logic type incorporates all of the electronic circuitry necessary to compute time and to drive a display such as an LED display with decoded multiplexed timekeeping signals. One such integrated circuit is described in copending patent applications Ser. Nos. 443,895; 443,535; 443,894; and 443,585, by Clark R. Williams, filed on Feb. 19, 1974 and assigned to the assignee of the present invention. Alternately, the integrated circuit may be mounted in an upside down fashion with the terminal pads 18 of the circuit 13 thermocompression bonded directly to the lead frame conductors 16 with the conductors 16 somewhat extended. Lead frame 10 also includes selectively positioned conductors 17 for connection of the display to the circuit, selectively positioned conductors 14 for connection of a variable capacitor in the circuit, and selectively positioned conductors 15 for connection of an oscillator crystal in the circuit. Selectively positioned conductors 20 are provided for connection of time setting and/or display demand switches to the battery and circuit and selectively positioned conductors 30 are provided for connection of one or more battery contacts to the circuit.

Figure 3:
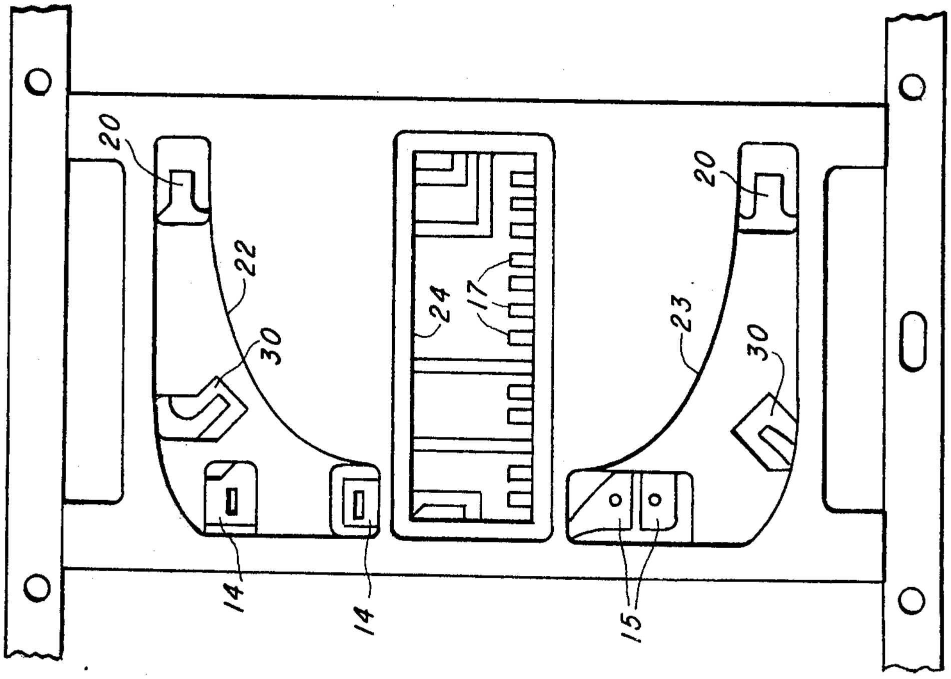
FIG. 3 is a planar view of the plastic encapsulated lead frame.

Next, as illustrated in FIG. 3, the lead frame is plastic encapsulated with the plastic being formed to completely encapsulate integrated circuit chip 13 and conductor wires 19 within the plastic. The plastic encapsulation is preferably by transfer injection molding techniques utilizing, for example, epoxy novolak, a well known material utilized in the injection molding of integrated circuit packages. The plastic may be transparent or translucent and may be colorless or of any desired color. The transfer injection molding takes place, for example, with the molds maintained at about 180° C under about 50–125 ton pressure with novolak injected at about 200 psi. The carrier portion of strip 11 and the portion 47 of metal which supports conductors 17 until the injection molding process is complete are then removed resulting in the structure of FIG. 4.

As shown in FIG. 3, the upper mold is formed to provide, in the injected plastic, cavity 24 for support of the display with the cavity extending to provide an opening exposing the conductors 17 to which the display is to be ohmically connected and a ridge 24*a* for support of a lens or filter. The upper mold is also formed to provide in the injected plastic selectively shaped openings 22 and 23 exposing selectively positioned conductors 14, 15, 20 and 30.

Figure 4:
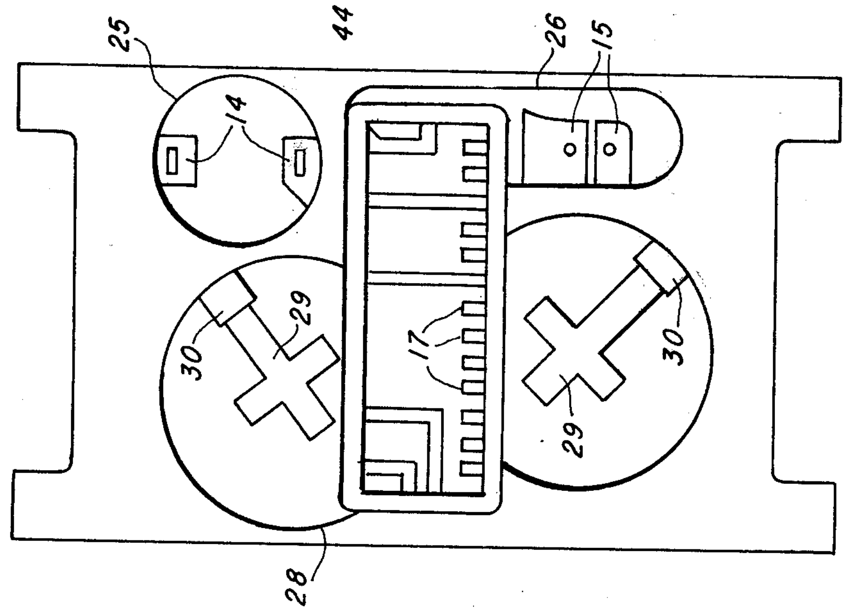
FIG. 4 is a bottom planar view of the encapsulated lead frame after the carrier portion has been removed.
Figure 7D:
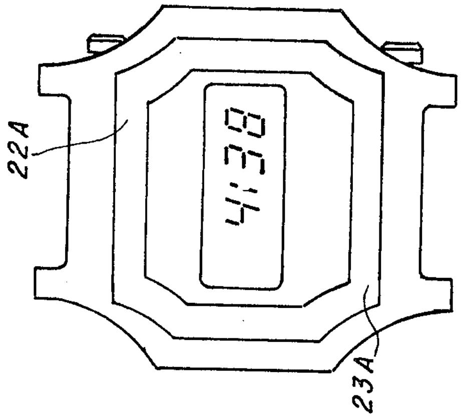
FIGS. 7A–D are top planar views of other watch embodiments of the present invention.
Figure 7C:
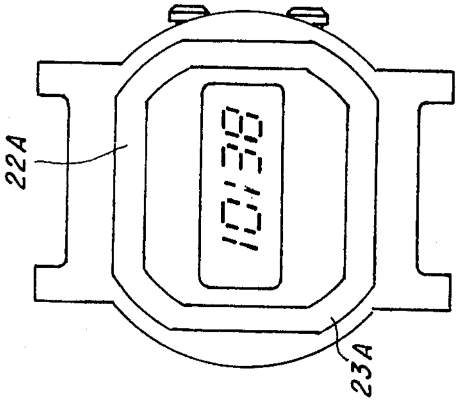
Figure 7B:
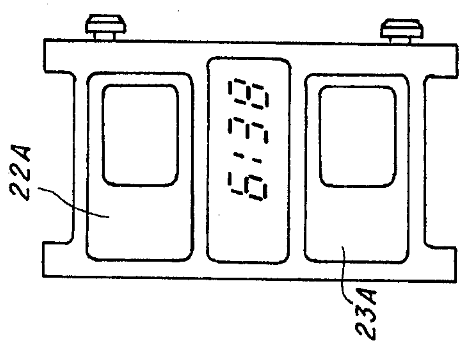
Figure 7A:
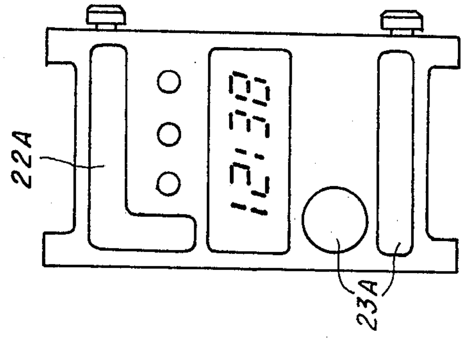

Referring to FIG. 4, the lower mold is formed to provide in the injected plastic a mechanical support cavity 25 for the variable capacitor, mechanical support cavity 26 for the oscillator crystal and mechanical support cavities 28 for the batteries. The lower mold also provides an opening 44 in the injected plastic exposing the opposite surface of the conductors 17 to which the display is to be connected. The cavities 25 and 26 extend to the lead frame exposing the conductors 14 and 15 to which the capacitor and crystal are to be ohmically connected while the battery cavities 28 are shallower and do not extend to the lead frame. Battery contacts 29 are mounted in electrical connection with the selected lead frame conductors 30 in FIG. 4.

Figure 5:
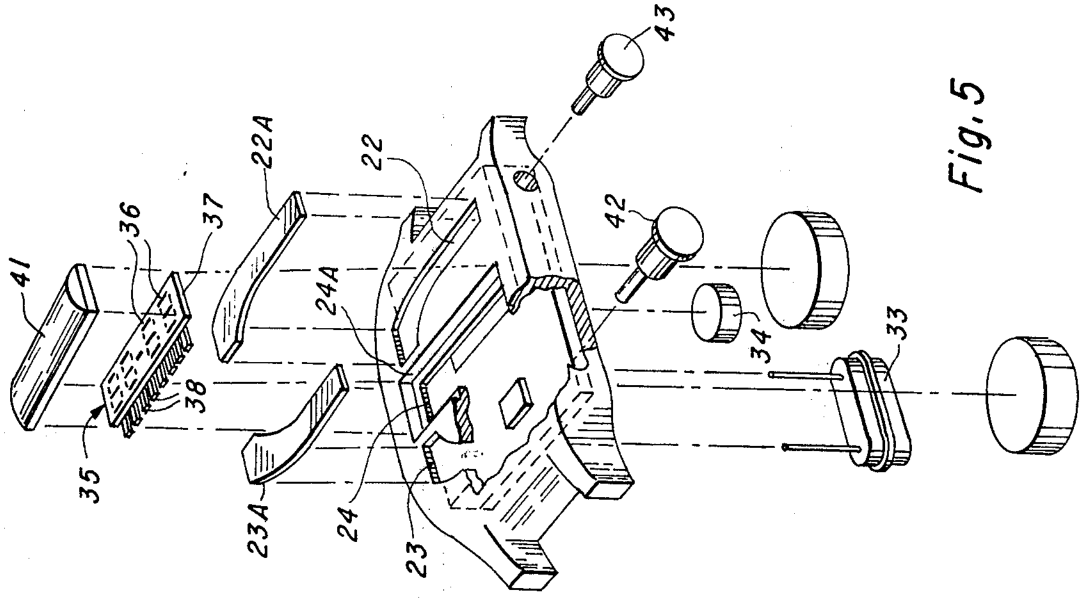
FIG. 5 is a perspective exploded view of the watch of FIGS. 3 and 4 showing the insertion of the crystal, capacitor, control switches and batteries in the cavities provided therefor.

As illustrated in FIG. 5, an oscillator crystal 33 and a microminiature variable capacitor 34 are inserted into the cavities 26 and 25 respectively, and ohmically connected to the selectively positioned lead frame conductors 15 and 14 from the openings 23 and 22 provided in the upper surface of the structure by, for example, soldering techniques.

The display 35 is then mounted in cavity 24 on the upper surface of the molded structure and selectively electrically connected to the lead frame contacts 17 from the corresponding opening 44 in the bottom surface of the structure, as shown in FIG. 4. The display 15 is comprised, for example, of a plurality of segmented light emitting diode chips 36 mounted on a ceramic substrate 37. The segments 36 are connected to conductors on the ceramic with common segment conductors and common digit conductors 38 terminating on the underside of substrate 37. The conductors 38 mate up with respective conductors 17 of the lead frame and are ohmically bonded by thermocompression bonding or soldering techniques.

Figure 6:
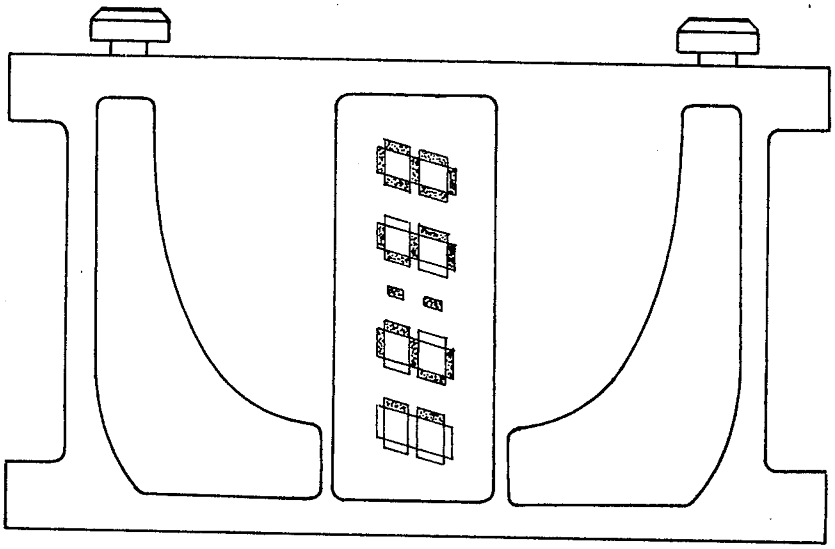
FIG. 6 is a planar view of the front face of the complete watch with the capacitor and crystal connection openings plugged and the display and lens in place.

As shown in FIG. 5, single pole, single throw pushbutton switches 42 and 43 are inserted in the watch case 40 to make ohmic contact with the selected lead frame conductors 20 to provide the time setting and/or display demand function control signals to the circuit. The switches 42 and 43 may be ohmically bonded to the contacts 20 through the openings 22 and 23. The openings 22 and 23 are then plugged with design coordinated plastic plugs 22A and 23A, respectively. The plugs 22A and 23A may be fastened to the watch face by means of any appropriate adhesive. The watch case also includes, for example, a filtering lens 41 for the light emitting diode display 35. A top view of the completed watch is shown in FIG. 6.

Additional embodiments of watches incorporated in the present invention are illustrated in FIGS. 7A–D, particularly pointing out the plastic plugs 22A and 23A utilized to seal the capacitor and crystal connection openings in an aesthetic manner. Although an LED type display is illustrated, it is contemplated that other displays such as liquid crystal or electrochromic display devices may be utilized in place of the LED display.

Since it is obvious that many additional changes and modifications can be made to the above described details without departing from the nature and spirit of the invention, it is understood that the invention is not to be limited to said details except as set forth in the appended claims.

What is claimed is:

1. An electronic watch comprising:

a. an integrated circuit chip having circuitry for driving a display means with decoded electrical timekeeping signals;

b. a lens member;

c. a metal lead frame having a plurality of lead conductors ohmically coupling said display means to said integrated circuit chip; and d. encapsulating means completely encapsulating said integrated circuit chip, said encapsulating means having a ridged cavity selectively positioned with respect to said plurality of lead conductors with said display means being supported within said cavity and said lens member being supported in spaced relation from said display means within said ridge.

2. The electronic watch according to claim 1 wherein an opening is provided in said encapsulating means opposite said cavity, said opening exposing a portion of said plurality of lead conductors to facilitate the ohmic connection of said display means to said lead conductors.

3. The electronic watch according to claim 1 wherein said display means includes a plurality of light emitting diode elements selectively positioned on a substrate member for generating a visual representation of a plurality of digits representative of time and wherein said lens member is of such color as to substantially only transmit light of the wavelength emitted by said light emitting diodes.

4. The electronic watch according to claim 3 wherein said substrate is comprised of a ceramic material with the diode elements mounted on one major surface thereof and including a plurality of conductor members on an opposite major surface thereof, said conductor members being positioned to mate with said plurality of lead conductors.

5. The electronic watch according to claim 1 wherein said encapsulating means is comprised of a molded plastic material.

6. An electronic watch comprising:

a. an integrated circuit chip having circuitry for driving a display means with decoded electrical timekeeping signals;

b. an oscillator crystal for providing a timekeeping standard to said integrated circuit chip;

c. a metal lead frame having a plurality of lead conductors ohmically coupling said oscillator crystal to said integrated circuit chip;

d. encapsulating means completely encapsulating said integrated circuit chip, said encapsulating means having a cavity selectively positioned with respect to said plurality of lead conductors with said oscillator crystal being supported within said cavity and an opening opposite said cavity, said opening exposing a portion of said plurality of lead conductors to facilitate the ohmic connection of said oscillator crystal to said lead conductors; and e. means for sealing said opening with said oscillator crystal connected in place.

7. The electronic watch according to claim 6 wherein said encapsulating means is comprised of a molded plastic material.

8. The electronic watch according to claim 6 wherein said encapsulating means includes a plurality of extension members for connection of a band to said watch.

9. An electronic watch comprising:

a. an integrated circuit chip having timekeeping circuitry for generating timekeeping signals and for driving a display means with decoded electrical signals corresponding to said timekeeping signals;

b. a variable capacitor device for adjusting the timekeeping signals generated by said timekeeping circuitry;

c. a metal lead frame having a plurality of lead conductors ohmically coupling said capacitor device to said integrated circuit chip;

d. means completely encapsulating said integrated circuit chip, said encapsulating means having a cavity selectively positioned with respect to said plurality of lead conductors with said capacitor device being supported within said cavity exposed to an opening of said cavity for adjustment of said capacitor device and an opening opposite said cavity exposing a portion of said plurality of lead conductors to facilitate the connection of said capacitor device to said lead conductors; and e. means for sealing said opening with said capacitor device in place.

10. The electronic watch according to claim 9 wherein said encapsulating means is comprised of a molded plastic material.

11. The electronic watch according to claim 9 wherein said encapsulating means includes a plurality of extension members for connection of a band to said watch.

12. An electronic watch comprising:

a. display means responsive to electrical signals for displaying time;

b. an integrated circuit chip having circuitry for driving said display means with decoded electrical timekeeping signals;

c. an oscillator crystal;

d. a capacitor device;

e. a metal lead frame extending essentially in a single plane, said lead frame including:

i. a first plurality of lead conductors ohmically coupling said display means to said integrated circuit chip, ii. a second plurality of lead conductors ohmically coupling said oscillator crystal to said integrated circuit chip, iii. a third plurality of lead conductors ohmically coupling said capacitor device to said integrated circuit chip, and iv. a fourth plurality of lead conductors for ohmically coupling battery means to said integrated circuit chip;

f. encapsulating means completely encapsulating said integrated circuit chip, said encapsulating means having:

i. a first cavity selectively positioned with respect to said first plurality of lead conductors with said display means being supported within said first cavity, ii. a second cavity selectively positioned with respect to said second plurality of lead conductors with said oscillator crystal means being supported within said second cavity, iii. a third cavity selectively positioned with respect to said third plurality of lead conductors with said capacitor device being supported within said third cavity, iv. at least one additional cavity selectively positioned with respect to said fourth plurality of lead conductors for supporting at least one battery within said at least one additional cavity, and v. first and second openings opposite each of said second and third cavities, said openings respectively exposing a portion of said second and third pluralities of lead conductors to facilitate the ohmic connection of said oscillator crystal and capacitor device to said lead conductors; and g. a plurality of plug members for sealing said openings with said oscillator crystal and capacitor device in place.

13. The electronic watch according to claim 12 wherein a third opening is provided in said encapsulating material opposite said first cavity, said third opening exposing a portion of said first plurality of lead conductors to facilitate the ohmic connection of said display means to said lead conductors.

14. The electronic watch according to claim 12 wherein said encapsulating means is comprised of a molded plastic material.

15. The electronic watch according to claim 12 wherein said encapsulating means includes a plurality of extension members for connection of a band to said watch.

16. The electronic watch according to claim 12 including a removable back member for retaining said at least one battery in said at least one additional cavity.

17. The electronic watch according to claim 16 wherein a third opening is provided in said encapsulating material opposite said first cavity, said third opening exposing a portion of said first plurality of lead conductors to facilitate the ohmic connection of said display means to said lead conductors and wherein said at least one battery opening is at least partially coincident with said third opening and wherein said removable back member seals both said at least one battery opening and said third opening.

18. The electronic watch according to claim 12 wherein said display means includes a plurality of light emitting diode elements selectively positioned on a substrate member for generating a visual representation of a plurality of digits representative of time.

19. The electronic watch according to claim 18 wherein said substrate is comprised of a ceramic material with the diode elements mounted on one major surface thereof and including a plurality of conductor members on an opposite major surface thereof, said conductor members being positioned to mate with said plurality of lead conductors.

20. The electronic watch according to claim 12 wherein at least one of said fourth plurality of lead conductors is bent around extending into said at least one additional cavity for ohmically contacting a pole of a battery supported within said cavity.

21. The electronic watch according to claim 12 wherein said first cavity includes a ridge, the periphery of which is larger than the periphery of said first cavity and wherein a lens member is provided, said lens member being supported in spaced relation from said display means within said ridge.

22. The electronic watch according to claim 21 wherein said display means includes a plurality of light emitting diode elements selectively positioned on a substrate member for generating a visual representation of a plurality of digits representative of time and wherein said lens member is of such color as to substantially only transmit light of the wavelength enmitted by said light emitting diodes.

23. An electronic watch comprising:

a. a metal lead frame having upper and lower opposite major surfaces;

b. an integrated circuit chip mounted on the upper surface of said lead frame and selectively ohmically coupled to lead conductors of said lead frame, said integrated circuit chip having circuitry for driving a display means with decoded electrical timekeeping signals, said lead frame including:

i. a first plurality of lead conductors for ohmically coupling a display means to said integrated circuit chip, ii. a second plurality of lead conductors for ohmically coupling an oscillator crystal to said integrated circuit chip, and iii. a third plurality of lead conductors for ohmically coupling a capacitor device to said integrated circuit chip;

c. molded plastic encapsulating means encapsulating said integrated circuit means and said lead frame, said encapsulating means having:

i. a ridged first cavity selectively positioned with respect to said first plurality of lead conductors with a portion of said first plurality of lead conductors being exposed within said first cavity, said first cavity for mechanically supporting said display means in a position such that said display means is in ohmic contact with said portion of said first plurality of lead conductors and said ridge for supporting a lens member is spaced relation from said display means;

ii. a second cavity selectively positioned with respect to said second plurality of lead conductors with a portion of said second plurality of lead conductors being exposed within said second cavity, said second cavity for mechanically supporting said oscillator crystal in a position such that said oscillator crystal is in ohmic contact with said portion of said second plurality of lead conductors, and iii. a third cavity selectively positioned with respect to said third plurality of lead conductors with a portion of said third plurality of lead conductors being exposed within said third cavity, said third cavity for mechanically supporting said capacitor device in a position such that said capacitor device is in ohmic contact with said third plurality of lead conductors, iv. first, second and third openings opposite each of said first, second and third cavities respectively, said openings respectively exposing the opposite surfaces of the portions of said first, second and third pluralities of lead conductors to facilitate the ohmic connection of said display means, oscillator crytal and capacitor device to said lead conductors and v. a plurality of protruding end members for connection of a band to said watch.

24. The electronic watch according to claim 23 including a fourth plurality of lead conductors for ohmically coupling battery means to said integrated circuit chip, said encapsulating means having at least one additional cavity selectively positioned with respect to said fourth plurality of lead conductors for mechanically supporting at least one battery within said at least one additional cavity with a pole of such battery in contact with at least one of said fourth plurality of lead conductors or an extension thereof.

25. The electronic watch according to claim 24 including a removable back member for retaining said at least one battery in said at least one additional cavity.

26. The electronic watch according to claim 23 wherein said encapsulating means has upper and lower opposite major surfaces corresponding to the upper and lower opposite major surfaces of said metal lead frame and wherein said ridged first cavity is formed in said encapsulating means extending from the upper major surface of said encapsulating means to the upper major surface of said lead frame with the ridged portion closest to the upper major surface of said encapsulating means and wherein said second and third cavities are formed in said encapsulating means extending from the lower major surface of said encapsulating means to the lower major surface of the metal lead frame.

27. The electronic watch according to claim 23 including means for sealing said second and third openings with oscillator crystal and capacitor device connected in place.

28. The electronic watch according to claim 27 wherein said means for sealing said second and third openings are comprised of design coordinated plastic plug members in a shape which mates with the shape of said openings.

29. The electronic watch according to claim 23 including a lens member which fits in the ridge of said first cavity for filtering and protecting a display.

30. The electronic watch according to claim 29 wherein said display means includes a plurality of light emitting diode elements selectively positioned on a substrate member for generating a visual representation of a plurality of digits representative of time and wherein said lens member is of such color as to substantially only transmit light of the wavelength emitted by said light emitting diodes.

31. A method of fabricating an electronic watch comprising:

a. mounting a semiconductor integrated circuit chip having circuitry for driving a display means with decoded electrical timekeeping signals on a mounting pad of a metal lead frame, said lead frame including a first plurality of lead conductors for ohmically coupling a display means to said integrated circuit chip, a second plurality of lead conductors for ohmically coupling an oscillator crystal to said integrated circuit chip, a third plurality of lead conductors for ohmically coupling a capacitor device to said integrated circuit chip, and a fourth plurality of lead conductors for ohmically coupling one or more batteries to said integrated circuit chip;

b. bonding wire connectors between terminal pads on said integrated circuit chip and selected ones of said lead frame conductors;

c. placing the lead frame between upper and lower molds having mold cavities;

d. injecting a plastic material into the cavities of said upper and lower molds to encapsulate said integrated circuit chip and lead frame, the upper mold being formed to provide in the injected plastic a first cavity extending to one surface of said first plurality of lead conductors for the mechanical support of said display and first and second openings respectively exposing a portion of one surface of said second and third pluralities of lead conductors and the lower mold being formed to provide in the injected plastic second and third cavities for the mechanical support of said crystal and said capacitor extending to the opposite surface of said second and third pluralities of lead conductors respectively, one or more battery cavities, a third opening exposing a portion of the opposite surface of said first plurality of lead conductors and a plurality of protrusions for the connection of a band to the watch, e. removing the encapsulated lead frame from said mold;

f. inserting a display means in the display cavity and ohmically bonding said display means to said lead frame through said third opening;

g. inserting an oscillator crystal in said second cavity and ohmically connecting said oscillator crystal to said second plurality of lead conductors through said first opening;

h. inserting said capacitor device in said third opening and electrically connecting said capacitor device to said third plurality of lead conductors through said second opening, and i. sealing said second and third openings.

32. The method according to claim 31 wherein said plastic material is an epoxy material.

33. The method according to claim 31 wherein said second and third openings are sealed with an epoxy filler material.

34. The method according to claim 31 wherein said second and third openings are sealed with plastic plugs adherently bonded to said encapsulating material in said second and third openings.

35. The method according to claim 31 wherein said first cavity is formed to include a ridge and wherein a lens member is adherently bonded to said encapsulating material in said ridge in spaced relation from said display means.

36. The method according to claim 31 wherein a removable back member is formed which attaches to said encapsulated plastic for retaining said at least on battery on said at least one additional battery opening.

37. The method according to claim 31 including the step of bending at least one conductor of said fourth plurality of lead conductors into an opening in said one or more battery cavities to provide a contact means for coupling one pole of a battery to said integrated circuit chip.

38. A method of fabricating an electronic watch comprising:

a. selectively positioning a semiconductor integrated circuit chip having circuitry for driving a display means with decoded electrical timekeeping signals upside down on a metal lead frame, said lead frame including a first plurality of lead conductors for ohmically coupling a display means to selected terminal pads of said integrated circuit chip, a second plurality of lead conductors for ohmically coupling an oscillatory crystal to selected terminal pads of said integrated circuit chip, a third plurality of lead conductors for ohmically coupling a capacitor device to selected terminal pads of said integrated circuit chip, and a fourth plurality of lead conductors for ohmically coupling one or more batteries to selected terminal pads of said integrated circuit chip;

b. thermocompression bonding the terminal pads on said integrated circuit chip to contacted portions of said lead frame conductors;

c. placing the lead frame between upper and lower molds having mold cavities;

d. injecting a plastic material into the cavities of said upper and lower molds to encapsulate said integrated circuit chip and lead frame, the upper mold being formed to provide in the injected plastic a first cavity extending to one surface of said first plurality of lead conductors for the mechanical support of said display and first and second openings respectively exposing a portion of one surface of said second and third pluralities of lead conductors and the lower mold being formed to provide in the injected plastic second and third cavities for the mechanical support of said crystal and said capacitor extending to the opposite surface of said second and third pluralities of lead conductors respectively, one or more battery cavities, a third opening exposing a portion of the opposite surface of said first plurality of lead conductors and a plurality of protrusions for the connection of a band to the watch, e. removing the encapsulated lead frame from said mold;

f. inserting a display means in the display cavity and ohmically bonding said display means to said lead frame through said third opening;

g. inserting an oscillator crystal in said second cavity and ohmically connecting said oscillator crystal to said second plurality of lead conductors through said first opening;

h. inserting said capacitor device in said third opening and electrically connecting said capacitor device to said third plurality of lead conductors through said second opening, and i. sealing said second and third openings.

39. The method according to claim 38 wherein said plastic material is an epoxy material.

40. The method according to claim 38 wherein said second and third openings are sealed with an epoxy filler material.

41. The method according to claim 38 wherein said second and third openings are sealed with plastic plugs adherently bonded to said encapsulating material in said second and third openings.

42. The method according to claim 38 wherein said first cavity is formed to include a ridge and wherein a lens member is adherently bonded to said encapsulating material in said ridge in spaced relation from said display means.

43. The method according to claim 38 wherein a removable back member is formed which attaches to said encapsulated plastic for retaining said at least on battery on said at least one additional battery opening.

44. The method according to claim 38 including the step of bending at least one conductor of said fourth plurality of lead conductors into an opening in said one or more battery cavities to provide a contact means for coupling one pole of a battery to said integrated circuit chip.

45. A circuit packaging arrangement comprising:

a. a circuit device having a plurality of terminal pads;

b. an external circuit component;

c. a metal lead frame having a plurality of lead conductors including at least one of said lead conductors for ohmically coupling said external circuit component to said circuit device;

d. means selectively ohmically connecting the terminal pads of said circuit device to said lead conductors;

e. encapsulating means completely encapsulating said circuit device, said encapsulating means having:

i. a cavity therein selectively positioned with respect to said at least one lead conductor with a surface of a portion of said at least one lead conductor exposed through a first opening in a wall of said cavity, said external circuit component being supported within said cavity and ohmically connected to said at least one lead conductor through said first opening; and ii. a second opening opposite said first opening, said second opening exposing an opposite surface of said portion of said at least one lead conductor to facilitate the ohmic connection of said external device to said at least one lead conductor; and f. means for sealing said second opening with said external circuit component connected in place.

46. A method of packaging a circuit device comprising:

a. mounting said circuit device on a mounting pad of a metal lead frame, said lead frame including at least one lead conductor for ohmically coupling an external circuit component to said circuit device;

b. bonding wire connectors between terminal pads on said circuit device and selected ones of said lead frame conductors;

c. placing the lead frame between upper and lower molds having mold cavities;

d. injecting a plastic material into the cavities of said upper and lower molds to completely encapsulate said circuit device, the upper mold being formed to provide in the injected plastic a cavity or channel extending to one surface of at least a portion of said at least one lead conductor for the mechanical support of said external circuit component and the lower mold being formed to provide in the injected plastic an opening exposing a portion of the opposite surface of said at least one lead conductor;

e. removing the encapsulated lead frame from said mold;

f. inserting said external circuit component in said cavity;

g. ohmically bonding said external circuit component to said at least one lead conductor through said opening, and h. sealing said opening.

* * * * *